US006782224B2

(12) United States Patent
Kim

(10) Patent No.: US 6,782,224 B2
(45) Date of Patent: Aug. 24, 2004

(54) IMAGE FORMING APPARATUS HAVING STRUCTURE FOR PREVENTING NOISE AND VIBRATION OF DEVELOPING DEVICE

(75) Inventor: Young-Min Kim, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/022,212

(22) Filed: Dec. 20, 2001

(65) Prior Publication Data

US 2002/0168199 A1 Nov. 14, 2002

(30) Foreign Application Priority Data

May 9, 2001 (KR) .......................................... 2001-25078

(51) Int. Cl.[7] .............................................. G03G 15/00
(52) U.S. Cl. ....................................... 399/159; 399/116
(58) Field of Search ................................ 399/159, 116, 399/117, 107; 492/18, 47; 464/180

(56) References Cited

U.S. PATENT DOCUMENTS

| | | | | |
|---|---|---|---|---|
| 5,570,160 A | * | 10/1996 | Miwa et al. | ................. 399/116 |
| 5,845,173 A | * | 12/1998 | Zogg et al. | ............. 399/159 X |
| 6,075,955 A | * | 6/2000 | Cais et al. | ............... 399/159 X |
| 6,131,003 A | * | 10/2000 | Cais et al. | ............... 399/159 X |
| 6,438,338 B1 | * | 8/2002 | Mark et al. | ............. 399/159 X |
| 6,470,158 B2 | * | 10/2002 | Fritz et al. | ............... 399/159 X |

FOREIGN PATENT DOCUMENTS

| | | | |
|---|---|---|---|
| JP | 05-188840 | * | 7/1993 |
| JP | 08-202206 | * | 8/1996 |
| JP | 10-268703 | * | 10/1998 |
| JP | 11-038853 | * | 2/1999 |
| JP | 11-349737 | * | 12/1999 |

* cited by examiner

*Primary Examiner*—Sophia S. Chen
(74) *Attorney, Agent, or Firm*—Robert E. Bushnell, Esq.

(57) ABSTRACT

An image forming apparatus comprises a photosensitive drum, a pivot inserted through the center of the photosensitive drum for rotatably supporting the photosensitive drum, and a mass body disposed at the pivot in the photosensitive drum for changing a frequency of the pivot by changing the center of gravity and the shape of the pivot. The mass body is cylindrical in shape. Accordingly, noise and vibration of a developing device, generated due to friction between rollers and the photosensitive drum, are absorbed by the mass body. The natural frequency of the pivot is changed so that amplification of noise and vibration, due to resonance of a vibration frequency and the natural frequency, can be prevented. Therefore, exacerbation of the noise and the vibration can be prevented.

13 Claims, 3 Drawing Sheets

IMAGE FORMING APPARATUS HAVING STRUCTURE FOR PREVENTING NOISE AND VIBRATION OF DEVELOPING DEVICE

CLAIM OF PRIORITY

This application makes reference to, incorporates the same herein, and claims all benefits accruing under 35 U.S.C. §119 from my application IMAGE FORMING APPARATUS HAVING STRUCTURE FOR PREVENTING NOISE AND VIBRATION OF DEVELOPING DEVICE filed with the Korean Industrial Property Office on May 9, 2001 and there duly assigned Serial No. 25078/2001.

BACKGROUND OF THE INVENTION

1. Technical Field

The present invention relates to an electrophotographic image forming apparatus, such as a laser printer or a photo-copying machine. More particularly, the invention relates to a structure of an electrophotographic image forming apparatus capable of preventing noise and vibration generated from a developing device during the printing process.

2. Related Art

A laser printer, which is an image forming apparatus, uses an electrophotographic method to form an electrostatic latent image by projecting a laser beam onto a charged photosensitive medium, develops the electrostatic latent image as a visible image by use of toner particles, and transfers and settles the electrostatic latent image on a printing paper.

The laser printer comprises a paper-distributing unit for transferring paper from a stack of paper disposed in a tray to a paper-transferring path, a developing device which forms a toner image based on a printing signal on a photosensitive drum by means of an electrophotographic process, and which transfer the toner image from the paper distributing unit to the transferred paper, and a settling unit for settling the toner image transferred to the paper.

In prior developing devices, when the amount of toner supplied to the photosensitive drum from the supplying roller through the developing roller is small (in other words, when an image having little data is printed, or when the toner in the toner accommodating chamber is almost used), the toner insufficiently covers the surfaces of the supplying roller, the developing roller, the charging roller, the transferring roller and the photosensitive drum. Accordingly, the surface of each roller and of the photosensitive drum directly contact each other. Therefore, abrasion of the rollers, as well as noise and vibration, can occur due to friction between the rollers and the photosensitive drum which, in turn, is due to their rotating in direct contact with each other. In addition, a resonance is generated since a frequency, which is generated by the noise and the vibration caused by the friction between the rollers and the photosensitive drum, is overlapped with a natural frequency of the developing roller and the photosensitive drum. The noise becomes exacerbated due to the resonance, and the printing of the image cannot be performed well because of the vibration of the entire image forming apparatus.

SUMMARY OF THE INVENTION

The present invention has been developed to overcome the above-mentioned problems of the related art.

Accordingly, it is an object of the present invention to provide an image forming apparatus having a structure which prevents noise and vibration from being generated in a developing device, even when the rollers and the photosensitive drum are rotated in direct surface contact with each other due to an insufficient amount of toner.

The above object is accomplished by providing an image forming apparatus which includes the photosensitive drum, a pivot disposed at the center of the photosensitive drum for rotatably supporting the photosensitive drum, and a mass body disposed on the pivot of the photosensitive drum for changing a frequency of the pivot by changing the center of gravity and the shape of the pivot.

According to the present invention, noise and vibration of the developing device, generated due to friction between rollers and the photosensitive drum, is absorbed by the mass body. Moreover, since the frequency of the pivot is changed, exacerbation of the noise and the vibration can be prevented by a resonance among the noise, the vibration frequency, and the natural frequency of the pivot.

The mass body is disposed at the pivot and at a predetermined distance from an inner circumference of the photosensitive drum. The main body has a form capable of adding a distributed load longitudinally along the pivot, and is positioned toward the area at which noise and vibration of the photosensitive drum are generated.

Preferably, the mass body is made of rubber material, so that the effect of absorbing noise and vibration is increased.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference numerals indicate the same or similar components, and wherein.

DESCRIPTION OF THE PREFERRED EMBODIMENT

The present invention now will be described more fully hereinafter with reference to the accompanying drawings, in which preferred embodiments of the invention are shown.

Figure 1:
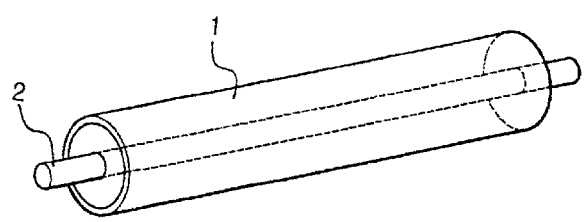
FIG. 1 is a perspective view schematically showing a photosensitive drum of an image forming apparatus.

FIG. 1 is a perspective view schematically showing a photosensitive drum of an image forming apparatus. Referring to FIG. 1, the photosensitive drum 1 is a cylinder having a cavity in it, and a pivot 2 is inserted through the center of the photosensitive drum 1 for rotatably supporting the photosensitive drum 1. The pivot 2 is preferably a round bar type, and is made of a conductive material for the purpose of grounding the photosensitive drum 1.

Figure 2:
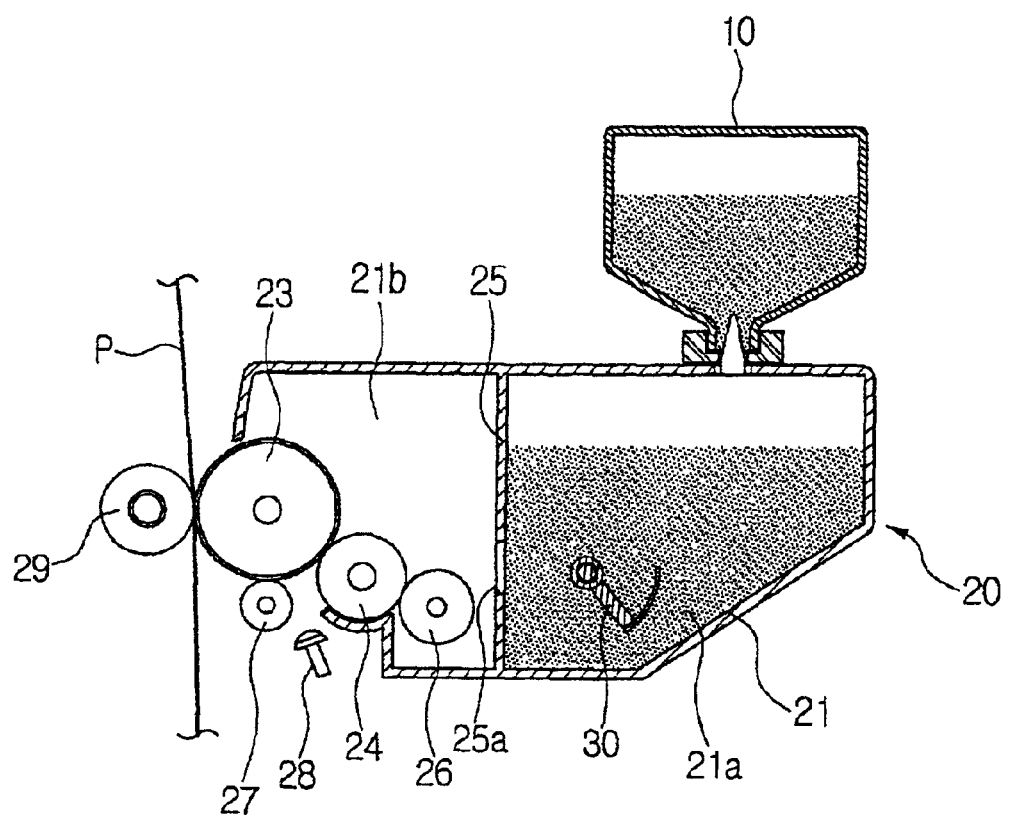
FIG. 2 is a side sectional view showing a developing device of an image forming apparatus according to the present invention.

FIG. 2 is a side sectional view showing a developing device of an image forming apparatus according to the present invention. Referring to FIG. 2, a developing device 20 of an image forming apparatus according to the present invention comprises: a developing body 21 having a toner accommodating chamber 21a and a developing chamber 21b; a photosensitive drum 23 having a photosensitive layer formed of photo-conductive material spread around the outer circumference of the photosensitive drum 1; a charging roller 27, an exposing unit 28, a developing roller 24, and a transferring roller 29 disposed along the outer circumference of the photosensitive drum 23; and a supplying roller 26 for supplying toner stored in the toner accommodating chamber 21a by contact with the outer circumference of the developing roller 24. The charging roller 27 contacts a photosensitive surface of the photosensitive drum 23 while being connected to a bias voltage for charging, and charges the photosensitive surface of the photosensitive drum 23 with a predetermined polarity and an electric potential as a result of being passively driven by the rotation of the photosensitive drum 23. The exposing unit 28 forms the electrostatic latent image by projecting a laser beam onto the photosensitive surface of the photosensitive drum 23 charged by the charging roller 27. The developing roller 24 visualizes the electrostatic latent image formed on the photosensitive drum 23 with the toner supplied by the supplying roller 26. The transferring roller 29 transfers the toner image to the printing paper P as a result of being supplied with a transferring potential of a polarity opposite to that of the charging electric potential of the toner.

As also seen in FIG. 2, a toner cartridge 10 adds toner to the toner accommodating chamber 21a. The toner accommodating chamber 21a and the developing chamber 21b are divided by a partition 25, and an opening 25a is formed in the partition 25 for supplying the toner in the toner accommodating chamber 21a to the supplying roller 26. The toner supplied from the toner cartridge 10 to the toner accommodating chamber 21a is blended by an agitator 30, and is discharged to the developing chamber 21b through the opening 25a. The toner drawn into the developing chamber 21b is supplied to the developing roller 24 by the supplying roller 26. The toner supplied to the developing roller 24 contacts the surface of the photosensitive drum 23 after being charged with a predetermined polarity at the developing roller 24. The latter predetermined polarity is the same as the polarity of the charging potential of the photosensitive drum 23. A predetermined developing bias from a power source (not shown) is applied to the developing roller 24, and consequently, when the toner on the developing roller 24 contacts the photosensitive drum 23, the toner adheres to the exposed part (the discharged part) but not to the unexposed part (the charged part) of the photosensitive drum 23 due to electrostatic interaction between the electric charge of the toner, the electrostatic latent image, and the developing bias. Therefore, a toner image corresponding to the electrostatic latent image is formed on the photosensitive drum 23.

Figure 3:
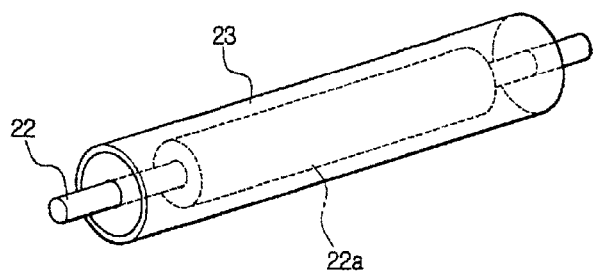
FIG. 3 is a perspective view schematically showing the photosensitive drum in the developing device.

FIG. 3 is a perspective view schematically showing the photosensitive drum in the developing device. Referring to FIG. 3, the photosensitive drum 23 is a cylinder having a cavity in it, and a pivot 22 is inserted through the center of the photosensitive drum 23 for rotatably supporting the photosensitive drum 23. The pivot 22 is made of conductive material for grounding the photosensitive drum 23.

The toner lubricates the area between the supplying roller 26 (FIG. 2) and the developing roller 24, and also the respective contacting surfaces between the developing roller 24, the charging roller 27 and the transferring roller 29, on one side, and the photosensitive drum 23, on another side. When the amount of toner supplied from the supplying roller 26 to the photosensitive drum 23 through the developing roller 24 is insufficient, the respective surfaces of the rollers 24, 27 and 29 and the surface of the photosensitive drum 23 contact each other directly since the respective surfaces of rollers 24, 27 and 29 and the surface of the photosensitive drum 23 are incompletely covered by the toner. Accordingly, not only do noise and vibration occur, but also abrasion of the rollers 24, 27 and 29 occurs due to friction between the rollers 24, 27 and 29 and the photosensitive drum 23 as a result of their rotation in direct contact with each other. Moreover, resonance occurs because a frequency generated by the noise and the vibration due to friction between the photosensitive drum 23 and the rollers 24, 27 and 29 overlaps with the natural frequency of the developing roller 24 and the photosensitive drum 23. To prevent the resonance from occurring, the frequency that generates the noise should be changed.

Generally, the frequency is calculated by the following mathematical expression:

$$f^2 = \alpha \frac{k}{m}$$

where 'f' is frequency, 'a' is a constant, 'm' is mass, and 'k' is a shape factor. As can be seen in the above expression, the shape factor 'k' and the mass 'm' should be changed in order to change the frequency band at which the noise and vibration occur. However, if the shape or the mass of the photosensitive drum 23 or of the developing roller 24 is changed, then the entire shape or the mass of the image forming apparatus is changed, and thus, the image cannot be well formed. Accordingly, it is preferable that the shape and the mass of the pivot 22, inserted through the photosensitive drum 23, be changed.

Therefore, according to the present invention, as shown in FIG. 3, by forming a mass body 22a on the pivot 22 in the photosensitive drum 23, the shape of the pivot 22 is changed and the mass of pivot 22 is increased, and thus the frequency of the pivot 22 is changed. The mass body 22a absorbs the noise and the vibration caused by the friction between the rollers 24, 27 and 29 and the photosensitive drum 23, and especially the friction between the developing roller 24 and the photosensitive drum 23. In addition, since the frequency of the pivot 22 is changed by the mass body 22a, it can prevent exacerbation of the noise and the vibration caused by the resonance generated as a result of the overlapping of the frequency due to the noise and the vibration and the frequency of the pivot 22.

The mass body 22a can be formed either integrally with the pivot 22 or separately. It is preferable that the mass body 22a have the shape of a cylinder for adding loads of even distribution to the longitudinal extent of the pivot 22. The mass body 22a can be formed so that the center of gravity is toward the portion experiencing friction between rollers 24, 27 and 29 and the photosensitive drum 23 at which the noise and vibration occur. It is preferable that the mass body 22a be disposed on the pivot 22 at a predetermined distance from the inner circumference of the photosensitive drum 23 since the noise and the vibration absorbed by the mass body 22a can be amplified if the mass body 22a and the photosensitive drum 23 contact each other.

The mass body 22a can be made of conductive material as is the pivot 22, but if the mass body 22a is made of rubber material, the efficiency of absorbing noise and vibration is increased.

As described above, according to the present invention, by forming the mass body 22a on the pivot 22 so as to add mass to the pivot 22 in the photosensitive drum 23, the noise and the vibration of the developing device 20, caused by friction between the photosensitive drum 23 and the rollers 24, 27 and 29, are absorbed at the mass body 22a. Moreover, since the frequency of the pivot 22 is changed, exacerbation of the noise and the vibration due to a resonance among the noise, vibration frequency, and the natural frequency of the pivot 22 can be prevented.

Although preferred embodiments of the present invention have been described, it will be understood by those skilled in the art that the present invention should not be limited to the described preferred embodiments, but various changes and modifications can be made within the spirit and scope of the present invention. Accordingly, the scope of the present invention is not limited within the described range, and is limited only by the following claims.

What is claimed is:

1. An image forming apparatus, comprising;
   a photosensitive drum;
   a mass body disposed within said photosensitive drum for adding mass to said photosensitive drum; and
   a shaft connected to said mass body;
   wherein an outer circumference of said mass body and an inner circumference of said photosensitive drum along an entire longitudinal length of said photosensitive drum are separated from each other by a gap, and are not in contact with each other.

2. The image forming apparatus of claim 1, wherein the mass body has a shape which adds an evenly distributed mass within said photosensitive drum in a longitudinal direction thereof.

3. The image forming apparatus of claim 2, wherein the mass body comprises a cylinder.

4. The image forming apparatus of claim 1, wherein the mass body damps at least one of noise and vibration within the photosensitive drum.

5. The image forming apparatus of claim 1, wherein the mass body is made of rubber material.

6. The image forming apparatus of claim 1, wherein said shaft extends through an entire longitudinal length of said mass body.

7. An image forming apparatus, comprising;
   a photosensitive drum having a cylindrical shape with an inner circumference, said inner circumference defining a hollow cavity within said photosensitive drum;
   a shaft extending through said hollow cavity along an entire longitudinal length of said photosensitive drum; and
   a mass body disposed on said shaft for adding mass to said photosensitive drum;
   wherein an outer circumference of said mass body and said inner circumference of said photosensitive drum along at least a portion of said longitudinal length of said photosensitive drum are separated from each other by a gap, and are not in contact with each other.

8. The image forming apparatus of claim 7, wherein the mass body is formed integrally with said shaft.

9. The image forming apparatus of claim 7, wherein the mass body has a shape which adds an evenly distributed mass within said photosensitive drum in a longitudinal direction thereof.

10. The image forming apparatus of claim 9, wherein the mass body has a cylindrical shape.

11. The image forming apparatus of claim 7, wherein the mass body damps at least one of noise and vibration of the photosensitive drum.

12. The image forming apparatus of claim 7, wherein the mass body is made of rubber material.

13. An image forming apparatus, comprising;
    a photosensitive drum; and
    a mass body disposed within said photosensitive drum for adding mass to said photosensitive drum;
    wherein an outer circumference of said mass body and an inner circumference of said photosensitive drum along an entire longitudinal length of said photosensitive drum are separate from each other by a gap, and are not in contact with each other, and the mass body is made of rubber material.

* * * * *